United States Patent
Cassaigne et al.

(10) Patent No.: US 9,464,939 B2
(45) Date of Patent: Oct. 11, 2016

(54) DETECTION DEVICE COMPRISING AN IMPROVED COLD FINGER

(71) Applicant: SOCIÉTÉ FRANÇAISE DE DÉTECTEURS INFRAROUGES—SOFRADIR, Palaiseau (FR)

(72) Inventors: Pierre Cassaigne, Grenoble (FR); Alexis Lenain, Grenoble (FR); Sébastien Gravier, Saint Martin d'Hères (FR); Georges Kapelski, Vaulnaveys le Haut (FR)

(73) Assignees: SOCIÉTÉ FRANÇAISE DE DÉTECTEURS INFRAROUGES—SOFRADIR, Palaiseau (FR); UNIVERSITÉ GRENOBLE ALPES, Saint-Martin-d'Hères (FR)

(*) Notice: Subject to any disclaimer, the term of this patent is extended or adjusted under 35 U.S.C. 154(b) by 0 days.

(21) Appl. No.: 14/335,073

(22) Filed: Jul. 18, 2014

(65) Prior Publication Data
US 2015/0021477 A1   Jan. 22, 2015

(30) Foreign Application Priority Data
Jul. 18, 2013 (FR) ..................... 13 01711

(51) Int. Cl.
*G01J 5/02* (2006.01)
*G01J 5/06* (2006.01)
(Continued)

(52) U.S. Cl.
CPC .............. *G01J 5/061* (2013.01); *H01L 31/024* (2013.01); *H01L 31/02016* (2013.01);
(Continued)

(58) Field of Classification Search
CPC ........... H01L 31/0235; H01L 31/1032; H01L 31/02016; H01L 31/024
See application file for complete search history.

(56) References Cited

U.S. PATENT DOCUMENTS 4,487,037 A * 12/1984 Meignin ................. F17C 3/085
250/332
4,954,708 A   9/1990 Salzer et al.
(Continued)

FOREIGN PATENT DOCUMENTS

FR         2967256      * 10/2004
JP      A-2005-252110       9/2005
(Continued)

OTHER PUBLICATIONS

English Translation of Abstract of FR 2967256.*
(Continued)

*Primary Examiner* — Yara B Green
(74) *Attorney, Agent, or Firm* — Oliff PLC

(57) ABSTRACT

The detection device comprises a cold finger which performs the thermal connection between a detector and a cooling system. The cold finger comprises at least one side wall at least partially formed by an area made from the amorphous metal alloy. Advantageously, the whole of the cold finger is made from the amorphous metal alloy.

5 Claims, 2 Drawing Sheets

(51) Int. Cl.
*H01L 31/024* (2014.01)
*H01L 31/02* (2006.01)
*H01L 31/0232* (2014.01)
*H01L 31/103* (2006.01)
*C22C 45/00* (2006.01)
*C22C 45/10* (2006.01)

(52) U.S. Cl.
CPC .... *H01L 31/02325* (2013.01); *H01L 31/1032* (2013.01); *C22C 45/003* (2013.01); *C22C 45/008* (2013.01); *C22C 45/10* (2013.01); *H01L 2224/16145* (2013.01); *H01L 2224/48091* (2013.01)

(56) References Cited

U.S. PATENT DOCUMENTS

| | | | |
|---|---|---|---|
| 5,834,778 A | * 11/1998 | Veyrier | H01L 31/024 250/352 |
| 6,122,919 A | * 9/2000 | Patel | G01J 5/061 250/352 |
| 6,682,611 B2 | 1/2004 | Zhang et al. | |
| 2006/0076089 A1 | 4/2006 | Chang et al. | |
| 2012/0056234 A1 | 3/2012 | Lee et al. | |
| 2014/0182824 A1 | 7/2014 | Hirotsuru et al. | |

FOREIGN PATENT DOCUMENTS

| | | |
|---|---|---|
| WO | WO 01/50680 A2 | 7/2001 |
| WO | WO 03/012157 A1 | 2/2003 |
| WO | WO 03/064076 A1 | 8/2003 |
| WO | WO 2004/009360 A1 | 1/2004 |
| WO | WO 2013/015158 A1 | 1/2013 |
| WO | WO 2013/058754 A1 | 4/2013 |

OTHER PUBLICATIONS

Yamasaki et al., "Thermal diffusivity and conductivity of $Zr_{55}Al_{10}Ni_5Cu_{30}$ bulk metallic glass," *Scripta Materialia*, 2005, vol. 53, pp. 63-67.

* cited by examiner

DETECTION DEVICE COMPRISING AN IMPROVED COLD FINGER

BACKGROUND OF THE INVENTION

The invention relates to a detection device comprising a cold finger forming a cooling support of an infrared detector.

STATE OF THE ART

In the field of detection devices, there is commonly a photodetector associated with a readout circuit. The photodetector delivers a signal representative of the observed scene and this signal is treated by the readout circuit.

Biasing of the photodetector is obtained by means of a substrate potential imposed on a first terminal of the photodetector and by means of a reference potential imposed on the second terminal of the photodetector. The reference potential is imposed by a read device of capacitive transimpedance amplifier type.

In order to obtain high detection performances, it is advantageous to use particular substrates, for example made from Mercury, Cadmium, Tellurium and to make this equipment operate at low temperature. The use of a low temperature enables stray electric disturbances to be limited when the optic signal is transformed into an electric signal.

In conventional manner, the detection circuit is thermally associated with a cooling device which performs heat removal. However this architecture is difficult to implement and the final performances of the device are not satisfactory.

Such a device mainly comprises a hollow part of elongate shape, preferably cylindrical of revolution, which is called "cold finger". On the top part, the cold finger enables thermal connection between the detection device which is to be cooled and the cooling system, for example a cryogenerator which enables the detection device to be taken to its operating temperature and this temperature to be maintained, while at the same time ensuring maximum thermal insulation between the top part which is at lower temperature and the bottom part which is hotter.

In conventional manner, it is advantageous to provide a cold finger which presents walls that are as thin as possible. Reduction of the dimensions of the cold finger and in particular of the thickness of the walls enables the thermal conductance of the cold finger to be reduced. For example, for a finger having a height of 50 mm and an external diameter of 6 to 10 mm, the walls have a thickness of about 0.1 mm.

The use of thin walls prevents a too great cooling energy expenditure from the cooling system.

The walls also play a role in preventing thermal leakage. The use of thin walls enables thermal leakage to be reduced by increasing the thermal resistance linked to the walls. The loss of cooling energy delivered by the cooling system to other elements than the detection device is thus minimized. The operating temperature is therefore more easily maintained, with a superfluous cooling energy expenditure that is as low as possible. A reduction of the thickness of the walls therefore enables the efficiency to be improved.

However, it has been observed that if the walls of the cold finger are too thin, they are no longer sufficiently rigid to prevent deformation of the cold finger during operation of the latter. This deformation of the cold finger results in a considerable loss of the optic performances of the detection device.

OBJECT OF THE INVENTION

It is observed that a requirement exists to provide a detection device that presents enhanced thermal performances while at the same time preserving a simple and robust design. Another of the objects of the invention is to propose a detection device in which the thermal losses are reduced to the minimum.

This object tends to be achieved by means of a detection device which comprises
  a readout circuit formed in a first semiconductor substrate,
  a hybridized detection circuit on a first main surface of the readout circuit,
  a cooling system thermally connected to the detection circuit and to the readout circuit,
  a cold finger configured to enable cooling of the readout circuit by the cooling system,
and wherein the cold finger comprises at least one side wall defining a confinement channel of a cooling gas from the cooling system, said at least one side wall being at least partially formed by an area made from amorphous metal alloy so as to form a thermal insulator.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PREFERRED EMBODIMENTS

Figure 1:
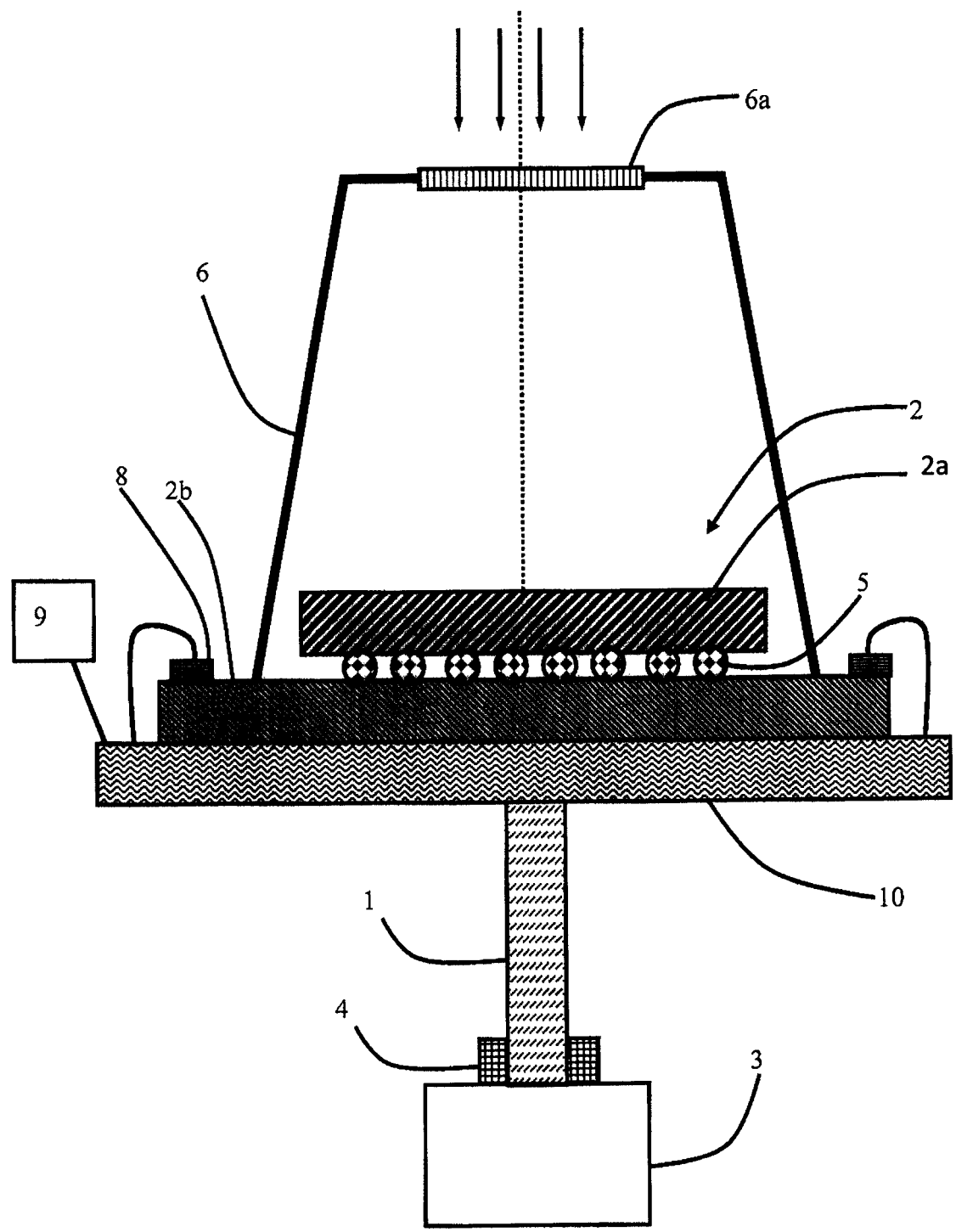
FIG. 1 represents, in cross-section, in schematic manner, a detection device comprising a detector coupled to a cooling system.

FIG. 1 schematically represents a cold finger 1 of a cooled detection device. Cold finger 1 comprises a hollow part of elongated shape. Cold finger 1 is preferably cylindrical in shape and in revolution. Cold finger 1 is designed to connect a detector 2 with a cooling system 3. One end of finger 1 is in contact with the area to be cooled, here the detector, and the other end is in contact with cooling system 3 which is at a higher temperature. A temperature gradient exists along cold finger 1.

This configuration ensures thermal insulation between the top part of the cold finger, for example at cryogenic temperature, and the bottom part of the cold finger which is at a higher temperature, for example at ambient temperature.

Cold finger 1 comprises at least one side wall which forms the sides of the finger. The sides of the cold finger can be broken down into one side wall or several side walls. Cold finger 1 advantageously comprises a top which closes cold finger 1, but it can also be envisaged to fix the side walls of cold finger 1 directly on the cold table or on another element. The top is designed to connect the future detector to the side wall.

The side walls of cold finger 1 comprise a part formed by an amorphous metal alloy, i.e. a metallic material which is in "glass" state. Thus, at least one side wall is at least partially formed by an area made from amorphous metal alloy.

Cold finger 1 is designed to enable cooling of detector 2 by cooling system 3 so that cooling system 3 cools detector 2 easily. In a particular embodiment, cold finger 1 has an interface with detector 2 or with a cold table which supports detector 2. Cold finger 1 also has an interface with cooling system 3, for example a cryogenerator.

Cooling system 3 can be a known expansion machine (commonly called "Joule Thomson") or a known cyclic machine, for example a machine using the Stirling cycle.

Cooling system 3 comprises an electromechanical oscillator which generates a pressure wave in an active enclosure containing a fluid. The fluid is advantageously a gas. The enclosure comprises a part provided with a mobile regenerator or mover which uses the expansion and compression cycles to perform a Stirling cycle. The enclosure is formed by the inside of cold finger 1 and expansion enables one end of cold finger 1 (the top of the cold finger in the figures) to be cooled, thereby cooling detector 2. The cold finger comprises at least one side wall defining a confinement channel of the cooling fluid from cooling system 3.

The fluid used is generally helium or nitrogen under a mean pressure of several hundred kilopascals. The oscillator can be rotary or linear.

It is also possible to use a Joule-Thomson type cooling system.

In general manner, cooling system 3 uses a fluid under pressure which is confined and which flows inside cold finger 1. The cooling fluid makes the thermal connection between readout circuit 2b and cooling system 3. The cold finger enables the cooling fluid to be channeled between readout circuit 2b and cooling system 3.

For a good resistance of the detection device in time, it is preferable for cold finger 1 to be impermeable to the fluid used by cooling system 3 to avoid increasing the consumption of the coolant in prohibitive manner and/or to impair the vacuum level inside the cryostat.

The top of cold finger 1 also called cold end is designed to thermally connect detector 2 to the rest of cold finger 1. In advantageous manner, the top is made from crystalline material, advantageously from crystalline metal, in order to obtain an efficient thermal connection with the detector. The top part of the side wall is on the other hand formed from amorphous metal to reduce the thermal conductivity as soon as connection is made with detector 2 or with an intermediate element. The top of the cold finger can be made from a material added onto the side walls or in one and the same part with the side wall. This configuration makes it possible to have a top part presenting a good thermal conduction with readout circuit 2b and a thermally insulating bottom part.

In advantageous manner, the area made from amorphous metal or amorphous metal alloy forms a ring so as to prevent formation of a heat loss channel between the readout circuit and a hotter area. In a particularly advantageous embodiment, the side wall is completely formed from amorphous alloy which enables the thermal efficiency of the cold finger to be increased.

In advantageous manner, cold finger 1 also comprises a base part 4 which preferably facilitates fixing to cooling system 3. Base part 4 can be made from an amorphous metal that is identical to or different from that used for the side walls. It is however possible to use a crystalline material to form base part 4. The material forming base part 4 is advantageously made from a material compatible with the assemblies to be implemented, for example to enable laser welding, brazing or electric welding.

Fixing to cooling system 3 can be performed in different manners, for example by screw-fastening, the tightness being achieved by specific seals.

For example, the side walls of a cold finger 1 have a height comprised between 20 and 40 mm and an external diameter equal to 6 mm, and they have a thickness comprised between 0.08 and 0.12 mm.

The use of an amorphous metal enables the thermal resistance to be increased in comparison with the same metal presented in its monocrystalline or polycrystalline form. In this way, a cold finger 1 formed at least partially by amorphous metal can have a reduced thermal conductivity compared with a cold finger 1 made from the same monocrystalline or polycrystalline material. The mechanical resistance is on the other hand identical between the two cold fingers. The reduction of heat losses is at least equal to 30% compared with a cold finger 1 according to the prior art.

The amorphous structure of the material enables energy transportation by the phonons and electrons to be reduced which has the effect of increasing the thermal resistance of cold finger 1. The part made from amorphous material enables the cold finger to be transformed into a thermal insulator.

The use of a material presenting enhanced thermal performances for example makes it possible to preserve a thickness of side wall configured to ensure a good tightness of the cold finger, for example good sealing of the vacuum in a cryostat.

In advantageous manner, the amorphous metal alloy is chosen from stainless steels and more particularly alloys of 304L and 316L grade, titanium-base alloys and more particularly $Ta_6V$ and $Ti_{22}V_4Al$ alloys.

These materials are particularly privileged as they ensure a good mechanical strength when cold finger 1 is subjected to a gas pressure greater than or equal to a few tens of bars, while at the same time providing the necessary tightness.

In addition to the materials presented above, it is particularly advantageous to use a cold finger 1 made from one of the following materials to obtain very good technical performances for operation of an infrared detector 2 operating at a temperature comprised between 50K and 150K.

It is possible to use amorphous Zirconium/Aluminium/Nickel/Copper alloys, in particular alloys in which the Zirconium, Aluminium, Nickel and Copper content represents 99% of the atoms of the alloy. More particularly, it is advantageous to use a $Zr_{55}Al_{10}Ni_5Cu_{30}$ alloy which presents a low thermal conductivity.

It is also advantageous to use Zirconium/Titanium/Copper/Nickel/Beryllium alloys, in particular alloys in which the Zirconium, Titanium, Copper, Nickel and Beryllium content represents 99% of the atoms of the alloy. More particularly, it is advantageous to use a $Zr_{41}Ti_{14}Cu_{12}Ni_{10}Be_{23}$ alloy which presents a low thermal conductivity.

It is also advantageous to use Iron/Nickel/Phosphorus/Boron alloys, in particular alloys in which the Iron, Nickel, Phosphorus and Boron content represents 99% of the atoms of the alloy.

It is also advantageous to use Iron/Boron alloys, in particular alloys in which the Iron and Boron content represents 99% of the atoms of the alloy. More particularly, it is advantageous to use a $Fe_{80}B_{20}$ alloy which presents a low thermal conductivity.

It is also advantageous to use Iron/Nickel/Chromium/Phosphorus/Boron alloys, in particular alloys in which the Iron, Nickel, Chromium, Phosphorus and Boron content represents 99% of the atoms of the alloy. More particularly, it is advantageous w use one of the alloys $Fe_{40}Ni_{40}P_{14}B_6$ or $Fe_{32}Ni_{36}Cr_{14}P_{12}B_6$ which present a low thermal conductivity.

It is also advantageous to use Palladium/Nickel/CopPer/PhosPhorus alloys, in particular alloys in which the Palladium, Nickel, Copper and Phosphorus content represents 99% of the atoms of the alloy. More particularly, it is advantageous to use a $Pd_{40}Ni_{10}Cu_{30}P_{20}$ alloy which presents a low thermal conductivity.

It is also advantageous to use Palladium/Nickel/Phosphorus alloys, in particular alloys in which the Palladium, Nickel and Phosphorus content represents 99% of the atoms of the alloy. More particularly, it is advantageous to use a $Pd_{40}Ni_{40}P_{20}$ alloy which presents a low thermal conductivity.

It is also advantageous to use Cobalt/Nickel/Iron/Silicon/Boron alloys, for example $Co_{58}Ni_{10}Fe_5Si_1B_{16}$.

In advantageous manner, the material forming the side walls of cold finger 1 is chosen from $Zr_{55}Al_{10}Ni_5Cu_{30}$, $Zr_{41}Ti_{14}Cu_{12}Ni_{10}Be_{23}$, $Fe_{40}Ni_{40}P_{14}B_6$ and $Fe_{32}Ni_{32}Ni_{36}Cr_{14}P_{12}B_6$.

It is further possible to use Iron/Cobalt/Yttrium/Boron alloys possibly comprising Chromium and/or Carbon, for example $Fe_{42}/Co_{30}/Y_6/B_{22}$ or $Fe_{43}/Co_{4.5}/Cr_{16.5}/Mo_{16.5}/C_{14}/B_{4}/Y_{1.5}$ ($Fe_{43}/Cr_5/Co_5/Mo_{12.5}/Mn_{11.2}/(C_{15.8}/B_{5.9})_{98.15}/Y_{1.5}$.

According to the embodiments, the side walls are formed by the same material with amorphous regions and crystalline regions. In advantageous manner, the whole height of the side walls is formed by the amorphous metal which enables heat losses to be reduced to the maximum.

In a particular embodiment, several different materials are used to form cold finger 1.

Reduction of the heat losses by a solid conduction through cold finger 1 enables a detection device to be designed which presents a reduced consumption of its cooling system 3. It is also possible to design a more compact detection device as the vertical dimensions of cold finger 1 can be reduced in order to keep substantially identical heat losses to those existing for a device according to the prior art.

Detector 2 or the detection device cooled by means of cold finger 1 comprises a detection circuit 2a and a readout circuit 2b. Readout circuit 2b and detection circuit 1 are electrically connected in such a way that readout circuit 2b processes the electric information transmitted by detection circuit 2a.

Readout circuit 2b is formed in a first semiconductor substrate and detection circuit 2a is hybridized on a first main surface of readout circuit 2b.

Detection circuit 2a comprises at least one photodetector 2 transforming an optic signal into an electric signal. In preferential manner, detection circuit 2a comprises a plurality of photodetectors 2. For example, photodetector 2 is a photodiode, a quantum well or a quantum multiwell device. In a preferred embodiment, photodetector 2 performs detection in the infrared field. For example, readout circuit 2b performs polarization of detection circuit 2a and transformation of a current signal transmitted by photodetector 2 into a voltage signal.

In a particular embodiment which can be combined with the previous embodiments, detection circuit 2a is formed on a first semiconductor substrate and readout circuit 2b is formed on a second semiconductor substrate so as to simultaneously obtain good detection characteristics and good electric performances of readout circuit 2b. The two substrates are formed from different materials. Advantageously, one or both of the two substrates are monocrystalline. For example, the substrate of detection circuit 2a is made from a material called II-VI, for example HgCdTe and the substrate of readout circuit 2b is a silicon-based substrate. In advantageous manner, the substrates made from II-VI material are cooled in order to provide enhanced detection performances. It is also possible to use a material called III-V, for example InSb or InGaAs.

To obtain a compact system, the two circuits are advantageously hybridized and they form the hybridized component. Hybridization of the two substrates is advantageously achieved by one or more balls 5 of electrically conducting material which are arranged between the two circuits. Detection circuit 2a is hybridized on a first main surface of readout circuit 2b so as to form a monoblock assembly and facilitate electric connection between these two circuits. The first main surface of readout circuit 2b is advantageously formed by a layer of electrically insulating material which covers the semiconductor substrate and inside which electrically conducting lines are arranged. The second main surface of readout circuit 2b is for example the rear surface of the semiconductor substrate.

A cold shield 6 is fixed onto readout circuit 2b or onto a cold table. Cold shield 6 is fixed so as to surround detection circuit 2a present on the first main surface of readout circuit 2b. Cold shield 6 can comprise a lens 6a.

Cold shield 6 is mainly made from a material opaque to the irradiation to be detected in order to form an opaque area. Cold shield 6 comprises an area transparent to the radiation to be detected, which enables the observation area of detection circuit 2a to be defined. The optic axis X of detection circuit 2a passes through the transparent area. The transparent area can be formed by a hole or by an optic device, for example one or more lenses which are used to delineate the observation area of the detection device. In this manner, the incident radiation passes through cold shield 6 before being collected by detection circuit 2a. In the illustrated embodiment, cold shield 6 is placed directly on the readout circuit, but it is also conceivable to place the cold shield on the cold table.

Figure 2:
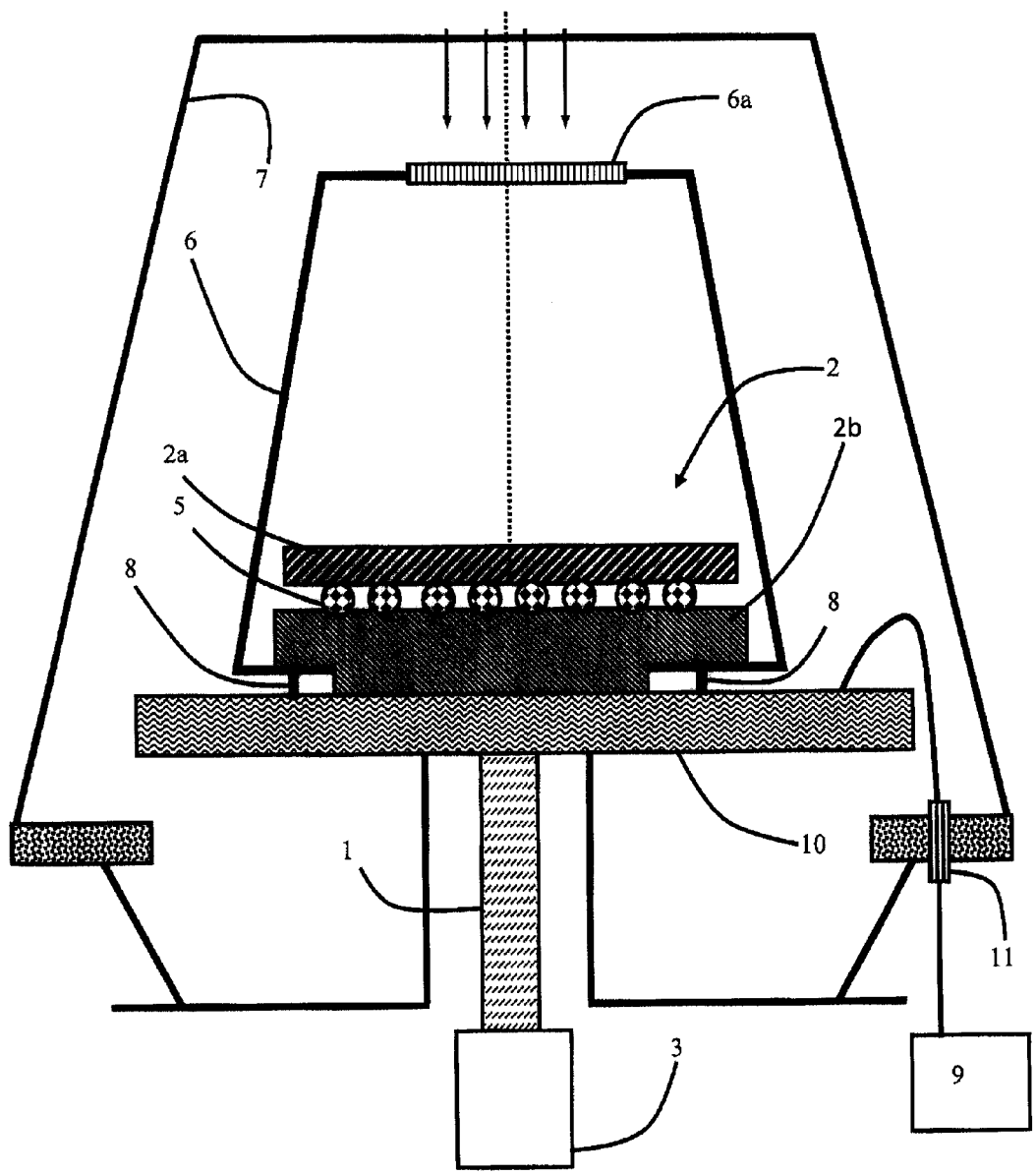
FIG. 2 represents, in cross-section, in schematic manner, an alternative embodiment of a detection device equipped with a cryostat.

In an advantageous embodiment illustrated in FIG. 2, the detection device comprises a Dewar flask 7 or cryostat which incorporates detector 2. A vacuum is created in the cryostat to limit the formation of convective and conductive currents which disturb operation of detector 2. Cold finger 1 is inserted in the cryostat so as to be thermally coupled to detector 2.

In this configuration, additional mechanical forces are applied to cold finger 1. The inner part of cold finger 1 is subjected to a pressure of several bars whereas the outer part is placed in a vacuum, for example at a pressure of about $10^{-5}$ mbar.

In preferential manner, the volume of this cavity is at a sub-atmospheric pressure. In an advantageous embodiment, detection circuit 2a is placed in a vacuum to reduce the thermal conduction of this part of the device. The outer part of the cryostat can then be in contact with a hot area whereas cold finger 1 serves the purpose of cooling detector 2.

In a particularly advantageous embodiment, readout circuit 2b comprises one or more connection studs or bumps 8 which are located outside the surface delineated by cold shield 6. These connection studs 8 enable transmission of electric signals from readout circuit 2b to other circuits of the detection device, for example a processing circuit 9 which is configured to process the image sent by readout circuit 2b and/or which is configured to modify the path of a mobile object on which the detection device is located.

Connection stud 8 is connected to the rest of readout circuit 2b by means of an electrically conducting wire which runs inside readout circuit 2b. In this manner, it is possible to have a flat surface ensuring a large mechanical connection between cold shield 6 and readout circuit 2b, a very good opacity to stray radiation and an increased impermeability to radiation. This configuration is particularly advantageous in the case where detection circuit 2a is in a controlled atmosphere or in a vacuum as the dependability of the device is increased. The electric connection between readout circuit 2b and processing circuit 9 is made outside the closed space by means of a connector. The connectors exit from readout circuit 2b outside the closed surface defined by the connection with cold shield 6.

Detection circuit 2a is designed to be thermally connected to cold source 3 formed by the cooling system in order to work at a reduced temperature. In the particular embodiment illustrated in FIGS. 1 and 2, the device comprises a cold table 10 on which readout circuit 2b is fixed. Cold table 10 acts as mechanical support for the hybridized component. In advantageous manner, cold table 10 is electrically connected to readout circuit 2b and participates in transit of the electric signals to processing circuit 9. The second main surface of readout circuit 2b can be fixed directly to cold table 10.

In this configuration, there are successively cold table 10, readout circuit 2b and detection circuit 2a. Table 10 is designed to be thermally connected to cold source 3 and the cold is imposed on readout circuit 2b and on detection circuit 2a by means of cold table 10. In other words, cold table 10 is designed to perform the thermal connection between detection circuit 2a and cold source 3. Cold shield 6 is advantageously configured to be at the same temperature as readout circuit 2b and detection circuit 2a.

When a cryostat is used, an additional electric connection 11 passes through the cryostat to connect the detector to processing circuit 9.

The invention claimed is:

1. A detection device comprising:
a readout circuit formed in a first semiconductor substrate,
a detection circuit hybridized on a first main surface of the readout circuit,
a cooling system thermally connected to the detection circuit and to the readout circuit,
a cold finger configured to enable cooling of the readout circuit by the cooling system,
wherein the cold finger comprises at least one side wall defining a confinement channel of a cooling gas originating from the cooling system, said at least one side wall being at least partially formed by an area made from amorphous metal alloy so as to form a thermal insulator, and
wherein the amorphous metal alloy is selected from the group consisting of Zirconium/Aluminium/Nickel/Copper alloys, Zirconium/Titanium/Copper/Nickel/Beryllium alloys, Iron/Nickel/Phosphorus/Boron alloys, Iron/Boron alloys, Iron/Nickel/Chromium/Phosphorus/Boron alloys, Palladium/Nickel/Copper/Phosphorus alloys, Palladium/Nickel/Phosphorous alloys, Iron/Cobalt/Yttrium/Boron alloys, and Cobalt/Nickel/Iron/Silicon/Boron alloys.

2. The detection device according to claim 1, wherein the area made from amorphous metal alloy forms a ring.

3. The detection device according to claim 2, wherein the at least one side wall is completely formed by an amorphous metal alloy.

4. The detection device according to claim 3, wherein the cold finger comprises a top formed from crystalline metal and connected to the readout circuit.

5. The detection device according to claim 1, wherein the amorphous metal alloy is selected from the group consisting of $Zr_{55}Al_{10}Ni_5Cu_{30}$ alloys, $Zr_{41}Ti_{14}Cu_{12}Ni_{10}Be_{23}$ alloys, $Fe_{80}B_{20}$ alloys, $Fe_{40}Ni_{40}P_{14}B_6$ and $Fe_{32}Ni_{36}Cr_{14}P_{12}B_6$ alloys, $Pd_{40}Ni_{10}Cu_{30}P_{20}$ alloys, $Pd_{40}Ni_{40}P_{20}$ alloys, $Fe_{42}/Co_{30}/Y_6/B_{22}$ or $Fe_{43}/C_{4.5}/Cr_{16.5}/Mo_{16.5}/C_{14}/B_4/Y_{1.5}$ or $(Fe_{43}/Cr_5/Co_5/Mo_{12.5}/Mn_{11.2}/C_{15.8}/B_{5.9})_{98.15}/Y_{1.5}$ alloys, and $Co_{58}Ni_{10}Fe_5Si_{11}B_{16}$ alloys.

* * * * *